United States Patent [19]
Brandes et al.

[11] Patent Number: 6,031,250
[45] Date of Patent: Feb. 29, 2000

[54] INTEGRATED CIRCUIT DEVICES AND METHODS EMPLOYING AMORPHOUS SILICON CARBIDE RESISTOR MATERIALS

[75] Inventors: George R. Brandes, Southbury; Charles P. Beetz, New Milford; Xueping Xu, Danbury, all of Conn.; Swayambu V. Ramani, San Jose; Ronald S. Besser, Sunnyvale, both of Calif.

[73] Assignees: Advanced Technology Materials, Inc., Danbury, Conn.; Silicon Video Corporation, San Jose, Calif.

[21] Appl. No.: 08/575,484

[22] Filed: Dec. 20, 1995

[51] Int. Cl.$^7$ ................................ H01L 31/0312
[52] U.S. Cl. ............................. 257/77; 313/336
[58] Field of Search ................ 257/77, 10, 11; 313/309, 355, 336, 351, 346 R

[56] References Cited

U.S. PATENT DOCUMENTS

| | | | |
|---|---|---|---|
| 3,789,471 | 2/1974 | Spindt | 29/25.17 |
| 4,329,699 | 5/1982 | Ishihara et al. | 257/77 |
| 4,695,853 | 9/1987 | Hackleman et al. | 346/140 |
| 4,857,161 | 8/1989 | Borel et al. | 204/192.26 |
| 4,937,454 | 6/1990 | Itoh et al. | 250/370.11 |
| 4,940,916 | 7/1990 | Borel et al. | 313/306 |
| 5,075,591 | 12/1991 | Holmberg | 313/495 |
| 5,140,397 | 8/1992 | Haga et al. | 257/77 |
| 5,142,184 | 8/1992 | Kane | 313/309 |
| 5,159,430 | 10/1992 | Manning et al. | 357/51 |
| 5,194,780 | 3/1993 | Meyer | 315/169.3 |
| 5,232,865 | 8/1993 | Manning et al. | 437/60 |
| 5,283,500 | 2/1994 | Kochanski et al. | 315/58 |
| 5,449,970 | 9/1995 | Kumar et al. | 313/495 |
| 5,608,283 | 3/1997 | Twichell et al. | 313/309 |

FOREIGN PATENT DOCUMENTS 2650119   1/1991   France.

OTHER PUBLICATIONS

E.W. Brass, "Small SiliconCarbide Non–Linear Resistors: Aspects of Rating and Their Application to Spark Suppression", *Electronic Engineering*, pp. 660–667 (Dec. 1968).

E.C. Sakshaug, "A Brief History of AC Surge Arresters", *IEEE Power Engineering Review*, pp. 11–15 (Aug. 1991).

S. Komastsu, et al., "A Preparation and Characterization of Reactively Sputtered $SiC_xN_y$ Films", *Thin Solid Films*, vol. 193/194, pp. 917–913 (1990).

Takeshi Nagai, et al., "SiC Thin Film Thermistor", *Thin Solid Films*, vol. 125, pp. 355–359 (Oct. 11, 1984).

*Primary Examiner*—Sara Crane
*Attorney, Agent, or Firm*—Oliver A. Zitzmann; Robert Flanagan

[57] ABSTRACT

Integrated circuits, including field emission devices, have a resistor element of amorphous $Si_xC_{1-x}$ wherein $0<x<1$, and wherein the $Si_xC_{1-x}$ incorporates at least one impurity selected from the group consisting of hydrogen, halogens, nitrogen, oxygen, sulphur, selenium, transition metals, boron, aluminum, phosphorus, gallium, arsenic, lithium, beryllium, sodium and magnesium.

40 Claims, 6 Drawing Sheets

INTEGRATED CIRCUIT DEVICES AND METHODS EMPLOYING AMORPHOUS SILICON CARBIDE RESISTOR MATERIALS

BACKGROUND OF THE INVENTION

The present application relates to integrated circuit devices and methods which employ amorphous silicon carbide resistor materials, including field emission devices, as well as methods for fabricating and using the foregoing.

The development of high density integrated circuit technology has been limited by the inability to provide suitable materials for integrated circuit resistor elements. Such materials typically must possess the ability to withstand intense electric fields without suffering breakdown, since their dimensions are so small. Moreover, the small size of these components requires high, tunable resistivity in order to achieve useful component resistances in many applications.

One promising application for integrated circuit technology is in the fabrication of flat panel displays that employ cold cathode field emission. Efforts to develop such devices have sought to utilize a large number of microtip emitters in each display pixel to achieve useful field emission current levels. But shorts, which can occur between some of the emitters and the gate can make the device inoperable. Variations in emitter geometries and in surface chemical properties can result in non-uniform field emission and varying brightness across the display. It has been proposed to insert a resistor layer between the microtip emitters and their current source (normally a cathode electrode) to overcome these problems.

A key to the successful development of such flat panel field emission displays, therefore, is the development of a resistor material having sufficiently high resistivity and capable of withstanding the intense electric fields which arise when breakdown occurs at the microtip emitters.

High speed, high density static RAM applications require the fabrication of integrated circuit resistor elements of very small dimensions, and consequently, require materials having high resistivity and the capability to withstand intense electrical fields. Similar requirements exist in other integrated circuit applications in which resistor elements are useful.

For a material to be suitable for this application, it should be possible to form electrical contacts with the material readily and the resistor material must be compatible with other materials used in fabricating the device. For example, the material should not react with other materials in the device.

The cost of device fabrication is another very important consideration. Materials which require high fabrication temperatures typically are undesirable since this limits the choice of compatible materials which can withstand such high temperatures without an undesirable change in their properties. In the case of flat panel field emission displays, low temperature processing is desirable to permit the use of less expensive substrates. At the same time, the resistor material should form a highly uniform film when it is deposited at such low temperatures. Another important consideration is the ability to selectively etch the materials to achieve the desired structure.

Yet another important consideration is that a suitable resistor material should have characteristics which either do not change after deposition as a result of further cathode processing, or else change in a limited and predictable way. Likewise, over time as the device is used repeatedly, the characteristics of the resistor material should either remain the same or change in a limited and predictable fashion.

While silicon has been proposed for use as such a resistor material, it is impractical to fabricate silicon resistor layers possessing sufficiently high resistivity for many applications. To achieve high resistivity in silicon, it is necessary to deposit this material in a very pure form which substantially increases fabrication cost.

It has been proposed to use cermet materials for use as resistor layers in flat panel field emission devices. However, it has proven very difficult to provide cermet resistor layers having sufficiently high resistance, as well as to select a desired resistance of such materials through doping. The resistivity of cermet also changes with thermal cycling and it is difficult to deposit and etch this material uniformly. Moreover, cermet has a grain structure that leads to uneven contact with the microtip emitters of the device and consequently, affects the resistances between the emitters and cathode electrode uncontrollably. This leads to uneven resistance values which result in non-uniform emission among the emitters.

Amorphous materials lacking such a grain structure do not share this drawback, and they are readily fabricated and processed. However, amorphous materials are thought to be unstable, tending to change their properties substantially over time or as a result of further processing after layer formation. Amorphous silicon with hydrogen added can have a suitably high resistivity, but hydrogen gas evolution can cause problems in amorphous materials processed at higher temperatures since it results in changes in material properties, and in some cases can form gas bubbles which disrupt the material.

OBJECTS AND SUMMARY OF THE INVENTION

It is an object of the present invention to provide integrated circuit devices incorporating resistor materials having high resistivity and capable of withstanding high electric fields, as well as methods for fabricating and using the same.

It is a further object of the present invention to provide such devices and methods of fabricating the same which are inexpensive to implement.

It is a further object of the present invention to provide such devices which operate over long periods of time and despite repeated use, without substantial degradation in their operating characteristics.

It is yet another object of the present invention to provide flat panel field emission devices which employ resistor layers to achieve uniform field emission across the display and which are operable without substantial risk of destruction due to breakdown.

In accordance with one aspect of the present invention, a field emission device is provided having a resistor element which comprises amorphous $Si_xC_{1-x}$ wherein $0<x<1$, and wherein the $Si_xC_{1-x}$ incorporates at least one impurity selected from the group consisting of hydrogen, halogens, nitrogen, oxygen, sulphur, selenium, transition metals, boron, aluminum, phosphorus, gallium, arsenic, lithium, beryllium, sodium and magnesium.

In accordance with another aspect of the present invention, a method of making a field emission device is provided comprising forming a resistor element on a substrate, the resistor element comprising amorphous $Si_xC_{1-x}$ wherein $0<x<1$ and the amorphous $Si_xC_{1-x}$ incorporates at least one impurity selected from the group consisting of hydrogen, halogens, nitrogen, oxygen, sulphur, selenium, transition metals, boron, aluminum, phosphorus, gallium, arsenic, lithium, beryllium, sodium and magnesium, and forming at least one electron emitting structure on the substrate coupled with the resistor element.

In accordance with a further aspect of the present invention, a method of emitting electrons from a field emission device is provided comprising: providing a field emission device mounted on a substrate wherein the field emission device comprises at least one electron emitting structure and a resistor element coupled with the emitting structure; and applying an electric field to the emitting structure such that electric current is conducted through the resistor element to the emitting structure and electrons are emitted therefrom, wherein the resistor element comprises amorphous $Si_xC_{1-x}$ wherein $0<x<1$ and the $Si_xC_{1-x}$ incorporates at least one impurity selected from the group consisting of hydrogen, halogens, nitrogen, oxygen, sulphur, selenium, transition metals, boron, aluminum, phosphorus, gallium, arsenic, lithium, beryllium, sodium and magnesium.

In accordance with yet another aspect of the present invention, an integrated circuit is provided comprising a substrate, a resistor layer comprising amorphous $Si_xC_{1-x}$ wherein $0<x<1$, wherein the $Si_xC_{1-x}$ incorporates at least one impurity selected from the group consisting of hydrogen, halogens, nitrogen, oxygen, sulphur, selenium, transition metals, boron, aluminum, phosphorus, gallium, arsenic, lithium, beryllium, sodium and magnesium, and a current conducting layer, the resistor layer having a first region of first resistivity contiguous with the current conducting layer and a second region of second resistivity higher than the first resistivity and contiguous with the first region, the second region being spaced from the current conducting layer by the first region, a first one of the resistor layer and the current conducting layer being on the substrate and a second one of the resistor layer and the current conducting layer being on the first one thereof.

In accordance with a still further aspect of the present invention, a method of making an integrated circuit comprises providing a substrate, forming a first layer on the substrate, and forming a second layer on the first layer, a first one of the first and second layers comprising a resistor layer comprising amorphous $Si_xC_{1-x}$ wherein $0<x<1$, wherein the $Si_xC_{1-x}$ incorporates at least one impurity selected from the group consisting of hydrogen, halogens, nitrogen, oxygen, sulphur, selenium, transition metals, boron, aluminum, phosphorus, gallium, arsenic, lithium, beryllium, sodium and magnesium, and a second one of the first and second layers comprises a current conducting layer, the resistor layer having a first region of first resistivity contiguous with the current conducting layer and a second region of second resistivity higher than the first resistivity and contiguous with the first region, the second region being spaced from the current conducting layer by the first region.

In accordance with yet still another aspect of the present invention, an integrated circuit is provided comprising a substrate, a resistor element formed on the substrate and comprising amorphous $Si_xC_{1-x}$ wherein $0<x<1$, and wherein the $Si_xC_{1-x}$ incorporates at least one impurity selected from the group consisting of hydrogen, halogens, nitrogen, oxygen, sulphur, selenium, transition metals, boron, aluminum, phosphorus, gallium, arsenic, lithium, beryllium, sodium and magnesium, and a current conducting element formed on or in the substrate and contacting the resistor element with a contact area of no more than about $10^{-8}$ cm$^2$.

In accordance with yet a still further aspect of the present invention, a method of making an integrated circuit comprises providing a substrate, forming a resistor element on the substrate comprising amorphous $Si_xC_{1-x}$ wherein $0<x<1$, and wherein the $Si_xC_{1-x}$ incorporates nitrogen as an impurity, annealing the resistor element at a first predetermined elevated temperature, and subsequently to the annealing of the resistor element, carrying out at least one further processing step at temperatures which do not exceed the first predetermined elevated temperature. In an advantageous embodiment of the method, a dielectric layer is formed on the resistor element prior to annealing.

The resistor materials employed in the present invention afford the ability to select their resistivity throughout a wide range of values extending from approximately 1 ohm cm up to approximately $10^{11}$ ohm cm through selection of the proportions of silicon and carbon as well as the selection of the concentration of the impurity or impurities. In certain advantageous embodiments of a field emission device according to the present invention, the resistor preferably has a resistivity ranging from $10^4$ ohm cm to $10^{10}$ ohm cm.

The inventive resistor materials provide a high resistance to electrical breakdown which affords the ability to incorporate a resistor element in the form of a thin layer in a field emission device.

The resistor element can be formed as a film using low processing temperatures which permits the use of relatively inexpensive substrates. In addition, while it has been found that amorphous materials in general are unstable so that their properties change undesirably when subjected to post-deposition processing at elevated temperatures, the relevant properties of annealed amorphous silicon carbide incorporating nitrogen as an impurity unexpectedly are substantially invariant despite such post-deposition processing, provided that the temperature of the material does not exceed that to which it has been subjected previously. This stability greatly facilitates fabrication of subsequent layers, further annealing of the device and the addition of impurities thereto at elevated temperatures, as well as flat panel display tube sealing.

Moreover, while it is necessary to heat crystalline silicon carbide to very high temperatures in order to make ohmic contact with this material, amorphous silicon carbide forms usable nearly ohmic contacts at much lower temperatures, for example, by ambient temperature evaporation of metal to form such contacts on the material.

In several advantageous embodiments of the invention, the field emission device comprises at least one electron emitting structure and is formed on a substrate, the resistor element being formed integrally therewith and coupled to the emitting structure in order to couple the same to a cathode electrode. In applications such as flat panel displays, a plurality of electron emitting structures are employed. Advantageously, the cathode electrode is a conductive layer on the substrate and the resistor element is in contact with the conductive layer. In embodiments such as flat panel field emission display devices, the field emission device comprises an anode coated with phosphors to emit light upon receipt of energetic electrons from the emitting structures, and a gate is provided for controlling the application of electric fields to the electron emitting structures to regulate emission therefrom. The ability to fabricate the resistor element at relatively low temperatures affords the selection of an inexpensive substrate material which is advantageously selected from the group consisting of ceramics, glasses, semiconductors, metals and alloys.

Desirably, the field emission device is fabricated in a vertically integrated structure including a cathode electrode layer formed on a substrate, a resistor layer having a first surface on the cathode electrode layer and a second surface opposite the first surface. The emitting structure is positioned on the second surface of the resistor layer. While the art has taught away from the use of such structures since practical resistor layers must be kept quite thin and thus experience intense electric fields when breakdown occurs at the emitters, the resistor materials employed in field emission devices according to the present invention are capable of withstanding such electric fields without breakdown.

The above, and other objects, features and advantages of the invention, will be apparent in the following detailed description of certain illustrative embodiments thereof which is to be read in connection with the accompanying drawings forming a part hereof, and wherein corresponding parts and components are identified by the same reference numerals in the several views of the drawings.

DETAILED DESCRIPTION OF CERTAIN ADVANTAGEOUS EMBODIMENTS

Figure 1A:
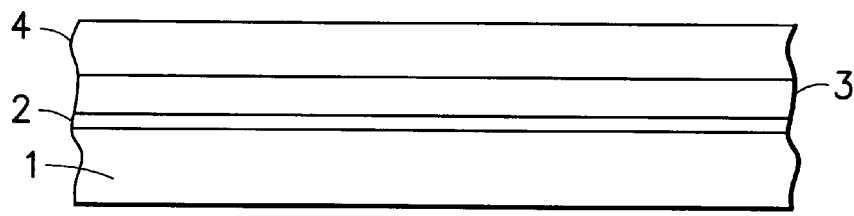
FIGS. 1(a) through 1(d) schematically illustrate steps in fabricating a field emission device in accordance with a first embodiment of the present invention.

Amorphous silicon carbide resistor elements can be formed having resistivities ranging from 1 ohm cm to $10^{11}$ ohm cm. This can be accomplished by selecting the silicon to carbon ratio, by introducing impurities that act, at least in part, to terminate or eliminate dangling-bond defects, typically making the material more resistive, and/or donor or acceptor impurities at selected concentrations. In particular, nitrogen can act as a terminating species in amorphous silicon carbide, and can also form nitrides of silicon and/or carbon therein. In either case nitrogen serves to increase the resistivity of the amorphous silicon carbide, such that its resistivity increases with increasing nitrogen concentration.

The ability to select the resistivity of this material within such a large range provides substantial flexibility in selecting device geometry, affording greater circuit density. For example, for flat panel display field emission cathodes having lateral resistor geometries, relatively low resistivities are required. However, vertical resistor geometries which afford greater circuit density require higher resistivities. For flat panel display field emission cathodes, for example, resistivities typically range from about $10^3$ ohm cm to about $10^9$ ohm cm, preferably are in the range of about $10^4$ ohm cm to about $10^8$ ohm cm, and most preferably are about $1 \times 10^5$ ohm cm to $5 \times 10^6$ ohm cm.

The introduction of a dangling-bond-terminating impurity or impurities in amorphous silicon carbide eliminates gap states and produces higher resistivity. The introduction of a dopant in amorphous silicon carbide introduces energy states in the band gap, which tends to reduce resistivity.

Amorphous silicon carbide resistor layers for field emission devices of the present invention may be formed by many deposition or film forming techniques. These permit precise selection of impurity concentrations, and a predetermined impurity concentration profile which varies with film depth, as will be explained in greater detail below. Such techniques include, but are not limited to, RF glow discharge, plasma enhanced CVD (chemical vapor deposition) or PECVD, RF sputtering, ion cluster beam deposition, ion beam sputtering, reactive sputtering, microwave discharge and photo CVD.

Preferably, lower temperature deposition is employed to permit selection of the substrate from a wide variety of substrate types, such as low cost glass substrates. The resistor layers may be fabricated as continuous films or as non-continuous regions through etching, shadow masking during deposition, lift-off, etc. The layers are formed in thicknesses ranging from about 0.025 micron to about 10 micron, with a range of about 0.1 micron to about 1.0 micron being preferred and a range of about 0.2 micron to about 0.5 micron being most preferable. As noted above, low temperature deposition processes are preferred, and the substrate temperature can be room temperature or below. Smoother films are obtained at lower pressures (15 mTorr) with low substrate temperature. Deposition at a substrate temperature of about 200° C. yields an advantageously large optical gap. Substrate temperatures during deposition of silicon carbide of less than 600° C. typically produce amorphous films.

The resistor films are substantially amorphous. Such material is uniform and can be readily formed at low temperatures. Empirically, the films are considered herein to be amorphous if x-ray diffraction scans do not show the discrete, sharp peaks of scattered radiation that are observed from crystalline or polycrystalline solids.

The resistivity of the silicon carbide films can be selected through the addition of dopant impurities such as boron, phosphorus, aluminum and arsenic, which tends to lower the resistivity of the material. For example, boron or phosphorus may be introduced into the a-SiC film during deposition by introducing dopant gases diborane or phosphine typically at a flow rate which is about 1/100% of the total gas flow. A dopant impurity can also be introduced directly into the target material.

The concentrations of the impurity or impurities are selected to achieve the desired resistivity after processing has been completed. The resistivity of the amorphous silicon carbide film incorporating nitrogen deposited by sputtering at ambient temperature is increased by roughly one order of magnitude upon heating to about 450° C. for fifteen minutes. A significant advantage of amorphous silicon carbide incorporating nitrogen is that its resistivity after heating at an elevated temperature up to at least 500° C., remains substantially invariant despite further processing at temperatures up to that elevated temperature, and without regard to processing time at such temperatures. This provides the advantage that processing temperatures and processing times can be selected freely without affecting the already determined resistivity of the film which affords repeatability and stability. Accordingly, in certain embodiments, the film is annealed after formation in order to determine its final resistivity so that it will be substantially unaffected by further processing at elevated temperatures which do not exceed the annealing temperature.

In embodiments in which a dielectric layer, such as silicon dioxide or silicon nitride, is formed on a resistor layer of amorphous silicon carbide incorporating nitrogen as an impurity, the annealing step is preferably carried out after the formation of the dielectric layer. This makes it possible to anneal the resistor layer and the dielectric layer in a single step. It also results in a smaller change in the resistivity of the resistor layer material as a result of annealing.

An embodiment of a field emission device for use in a flat panel display and a method of fabricating the device will now be explained with reference to FIGS. 1(a) through 1(d). With reference first to FIG. 1(a), a suitable substrate 1 is provided. Substrate materials which are suitable for this application include ceramics, glasses, semiconductors, metals and alloys or mixtures thereof. The ability to employ low device fabrication temperatures in this process permits the use of a low cost substrate material.

Although not required in all fabrication procedures, one or more layers 2, for example spin-on-glass or silicon dioxide, may be deposited on an upper surface of the substrate. The layer or layers 2 may be deposited, for example, by spin-on or sputter techniques, and can serve to planarize the fabrication surface and/or electrically isolate the substrate from the active elements of the device.

Next a cathode electrode layer or layers 3 are formed on the layer or layers 2. The layer(s) 3 advantageously include a metal layer deposited by metal evaporation, sputtering or other technique known to one skilled in the art, although other types of conductive materials, as well as semiconductive materials such as silicon, may be used to fabricate the cathode electrode layer(s) 3.

The cathode electrode layer(s) 3 may be a continuous layer or may be patterned to form a plurality of separate cathode electrode layers, for example, to afford the ability to separately address individual pixels of the flat panel display. As an exemplary embodiment, the cathode electrode layer(s) 3 may include a thin layer of titanium (about 0.03 microns thick), deposited on the layer or layers 2 and a thicker layer of molybdenum (about 0.3 microns thick) deposited on the titanium layer. The titanium layer promotes adhesion of the cathode electrode layer to the substrate. In certain embodiments, the layer(s) 3 comprises a 300 nm layer of nickel deposited on a substrate of Schott D-263 glass. Patterning may be accomplished by known shadow masking, lift-off or etch-back techniques.

After the cathode electrode layer or layers 3 have been deposited, a resistor layer 4 of amorphous silicon carbide including at least one impurity is deposited. The value x is selected such that 0<x<1 and at least one impurity is selected from the group consisting of hydrogen, halogens, nitrogen, oxygen, sulphur, selenium, transition metals, boron, aluminum, phosphorus, gallium, arsenic, lithium, beryllium, sodium and magnesium. Hydrogen, oxygen, and the halogens act at least as terminating species in a-SiC, tending to raise its resistivity. Nitrogen serves as a terminating species in a-SiC at low concentrations, and at higher concentrations acts both as a terminating species and forms nitrides of silicon and/or carbon. Nitrogen is preferred as the impurity since the resistivity of the layer 4 can be selectably and repeatably determined from the stoichiometry of the layer 4 and the maximum temperature to which the layer 4 is subjected. The resistivity of amorphous silicon carbide films can also be selected by incorporating a dopant impurity.

In certain embodiments, the resistor layer 4 is grown by RF sputtering using a Perkin-Elmer 4450 Production Sputtering system at a power level of 1000W. The sputter target is a high-purity beta silicon carbide target produced by chemical vapor deposition. The base pressure of the sputter chamber is set at about $10^{-6}$ Torr and the substrates to be coated are introduced via a load lock system. Prior to deposition of the layer 4, a sputter etch is performed in the chamber to remove contaminant layers from the cathode electrode layer(s) 3.

When deposition is commenced, nitrogen gas and argon gas are introduced into the chamber at flow rates established by mass flow controllers. Argon flow typically is fixed at about 480 sccm and the nitrogen flow is selected to achieve the desired resistivity thereof in the deposited resistor layer 4. The nitrogen flow is typically about 0.5% of the total gas flow. In certain embodiments the nitrogen flow rate is initially kept low so that a first region of the resistor layer 4 contiguous with the cathode electrode layer(s) 3 has a relatively low resistivity which provides a good ohmic contact of resistor layer 4 to the cathode electrode layer(s) 3. Then the nitrogen flow rate is increased to increase its concentration in the deposited material in a second region contiguous with the first region to a level which provides the desired average overall resistivity of the layer 4 once processing is completed. Before the deposition of the layer 4 is completed, the flow rate of the nitrogen is again reduced to produce a third region contiguous with the second region and having a relatively low resistivity to make good ohmic contact with a plurality of field emitters described below. Preferably, the third region is also heavily doped to minimize or essentially eliminate variations in specific contact resistance with the field emitters.

During the growth of resistor layer 4, the chamber pressure is typically about 23 mTorr. The substrates are rotated under the target during growth to ensure uniform coating. For example, a substrate in the form of a 4 inch wafer was placed upon a rotating platen. Coating of the wafer took place only 14% of the time. A measured deposition rate of 3.3 nm/min. was achieved. It is believed that the deposition temperature was approximately 70° C. based on measurements taken a few minutes after deposition.

The impurity may also be introduced during growth from a solid or liquid source. Moreover, the impurity may also be incorporated in the layer 4 by implantation or diffusion.

Like the layer(s) 3, the resistor layer 4 may be either continuous or patterned as a plurality of separate regions, for example, corresponding to separate regions of the layer(s) 3.

Variations in resistor film thickness, film homogeneity, specific contact resistivity, contact area and resistor-film resistivity will change the current-limiting resistance to each emitter. The variation in the current-limiting resistance due to a variation in the specific contact resistivity can be minimized or eliminated by heavily doping the contact region and cleaning the surface prior to emitter deposition. The variation in the current-limiting resistance due to the size of the emitter contact can be minimized by controlling the emitter deposition process, for example, by precise lithographic patterning. Amorphous silicon carbide films are intrinsically homogeneous on an appropriate scale. Film uniformity can be controlled by changing sample position relative to the target or targets (for example, by rotating the sample) during deposition, and controlling the gas composition and flow.

Figure 1B:
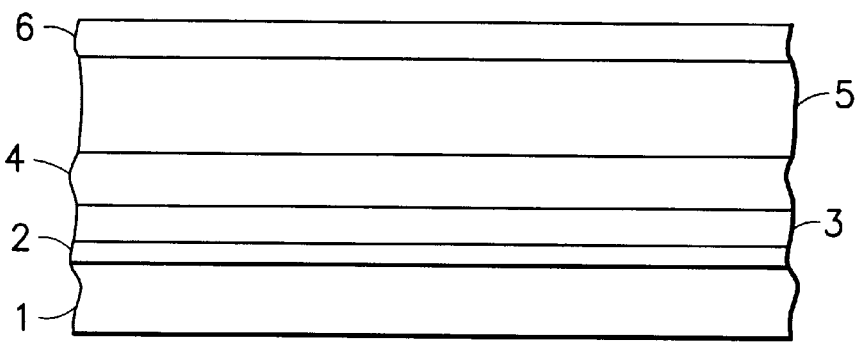

After the resistor layer 4 has been deposited, referring to FIG. 1(b) a dielectric layer 5 is deposited on the layer 4. The layer 5 may comprise, for example, $SiO_2$ or $Si_3N_4$ deposited by sputtering, plasma-enhanced chemical vapor deposition, low-pressure chemical vapor deposition or atmospheric chemical vapor deposition. Subsequently, a gate electrode layer 6 such as aluminum or nickel is deposited on the dielectric layer 5 by metal evaporation.

Where the resistor layer is formed of amorphous silicon carbide incorporating nitrogen as an impurity, as noted above annealing of the resistor layer at a predetermined temperature will establish its resistivity at a level that remains substantially invariant despite subsequent processing at temperatures up to the predetermined temperature. If the annealing step is carried out prior to the formation of the dielectric layer at a temperature of about 450° C. for fifteen minutes, the resistivity of the amorphous silicon carbide layer incorporating nitrogen will be increased by approximately one order of magnitude.

However, if annealing of the resistor layer 4 is postponed until after the formation of the dielectric layer 5, both of the layers 4 and 5 may be annealed in a single processing step. Moreover, the resistivity of the resistor layer 4 is changed as a result of annealing by an amount which is smaller than the order of magnitude change observed when annealing is carried out before formation of the dielectric layer.

As an example, amorphous silicon carbide layers incorporating nitrogen were formed by sputtering on nickel contacts and further nickel contacts were formed on opposite sides of the silicon carbide layers. These structures were encapsulated in a plasma-enhanced chemical vapor deposited silicon dioxide film having a thickness of 3500 angstroms. The silicon dioxide was deposited at a substrate temperature of less than 300° C. Current-voltage data of the devices thus fabricated were then taken. Then the devices were annealed at 450° C. in a vacuum ambient ($\leq 10^{-6}$ Torr) for one hour. Further current-voltage data of these devices were then obtained. The results indicated that the resistivity of the silicon carbide resistor layers had changed by a factor less than 2.

Figure 1C:
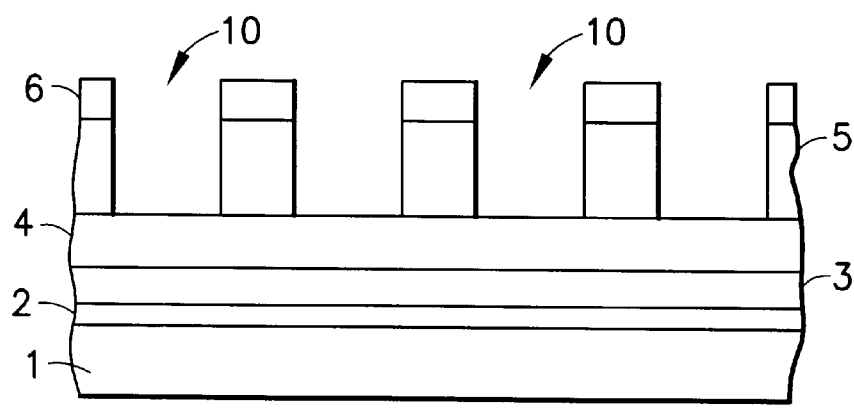
Figure 1D:
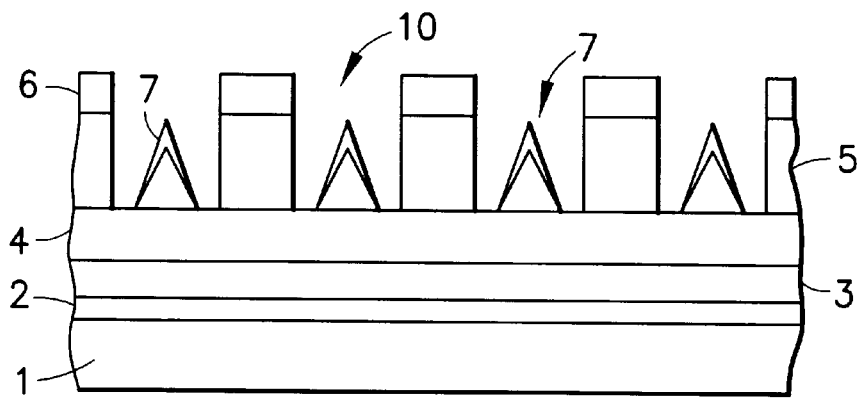

With reference now to FIG. 1(c), cavities 10 are formed in the layers 5 and 6 to define the locations of the emitters and expose the upper surface of the resistor layer 4 on which the emitters will be formed, as described below. The pattern of the cavities 10 is defined by means of a patterned resist which leaves the positions of the cavities exposed, and then the layers 5 and 6 are etched at the exposed positions, for example, by a reactive ion etch which is halted once the resistor layer 4 is exposed.

Thereafter microtip emitters 7 are formed on the exposed portions of the surface of resistor layer 4 in the manner described in U.S. Pat. No. 3,789,471 to Spindt. Essentially, at the same time that the metal forming the emitters is deposited from a source directly above the exposed surface of the device, a closure material is deposited from a source placed to the side of the device so that the closure material strikes the exposed surface of the device at a glancing angle. At the same time, the device is rotated so that the openings of the cavities 10 are gradually closed as the closure material is deposited and as the emitters 7 are formed in ever-decreasing diameters until the openings are completely covered. Then the closure material is removed to expose the emitters 7 in the cavities 10. This process is carefully controlled through patterning and lithographic etching to ensure that the contact area of each emitter 7 with the surface of the resistor layer 4 is substantially the same as all others to avoid substantial variations in contact resistance which result in noticeably non-uniform brightness. The emitters may be formed by depositing a first metal such as titanium which enhances adhesion, followed by depositing a second metal which readily emits electrons upon application of a suitable electric field. However, the emitters may also be formed by depositing a single metal such as molybdenum directly on the resistor layer 4.

The areas exposed by each of the cavities 10 typically are each about $10^{-8}$ cm$^2$. Accordingly, each of the microtip emitters 7 contacts the resistor layer 4 with an area of no more than about $10^{-8}$ cm$^2$, and typically contacts the resistor layer 4 with an area of less than $10^{-8}$ cm$^2$. The use of cermet and similarly granular materials in the resistor layer 4 can result in substantial variations in contact resistance from emitter to emitter. The resistor layer 4 of the present invention, however, is far more uniform which thus affords far less variation in contact resistance from emitter to emitter.

In the embodiment of FIG. 1, the gate electrode is formed as a plurality of electrodes when the cavities 10 are formed to permit selective application of extraction voltage thereto. This enables the device to selectively activate the emitters 7 to emit electrons in order to produce a visible display on a phosphor-coated anode of a flat panel display (not shown for purposes of simplicity and clarity).

FIG. 2 (a) is a schematic illustration of another field emission device embodiment in which a cathode electrode layer 12 is formed on the surface of a substrate 11 by, for example, sputtering, CVD or evaporation. The substrate may be covered with one or more planarizing and/or insulating layers (not shown for purposes of simplicity and clarity). A resistor layer 13 is formed as described above in connection with FIG. 1(a) and has the same composition as resistor layer 4 of FIGS. 1(a) through 1(d). Emitters 14 can be formed as described above in connection with FIGS. 1(c) and 1(d) through a patterned and etched dielectric layer (not shown for purposes of simplicity and clarity) followed by selective removal of the dielectric layer.

Other techniques may be used to form the emitters 14. For example, in certain embodiments emitters 14 take the form of carbon fibers catalytically grown in situ on the resistor layer 13. More specifically, carbon fibers can be grown on the resistor layer 13 with a density greater than 0.1 fiber per square micron by (1) the deposition and (if necessary) patterning of a metal catalyst such as Fe, Co or Ni on the resistor layer 13 and then (2) heating in an atmosphere containing a hydrocarbon, carbon-containing compounds and/or carbon monoxide. Methods for growing such carbon fiber emitters are described in greater detail in the U.S. patent application entitled Carbon Fiber-Based Field Emission Devices, inventors: Xueping Xu, et al., filed concurrently herewith and assigned to the assignee of the present application, the entire disclosure of which is incorporated herein by reference.

The emitters 14 can also take the form of carbon containing particles such as amorphous carbon, graphite, diamond and/or crystalline silicon carbide deposited on the resistor layer 13. Such particles may be deposited by applying a suspension thereof in alcohol on the layer 13 by means of an air brush or by spin on. Methods for forming such emitters are described in U.S. patent application Ser. No. 08/269,283 filed Jun. 29, 1994 entitled Structure and Fabrication of Electron-Emitting Devices Utilizing Electron-Emissive Particles which Typically Contain Carbon, inventors: Jonathan C. Twichell, et al., the entire disclosure of which is incorporated herein by reference.

A grid extraction and control electrode 15 is spaced from the emitters 14. Electron emission from the emitters 14 is induced by applying a suitable voltage between the cathode electrode 12 and the grid 15. A region of below-atmospheric pressure separates the emitters 14 from the grid 15. The device of FIG. 2(a) may serve as an electron source for spectrometers or microscopes. It also provides advantages for high frequency devices since the current flows through a near-vacuum from the emitters at a rate much faster than in solids and the gate-cathode electrode capacitance is relatively small.

Figure 2A:
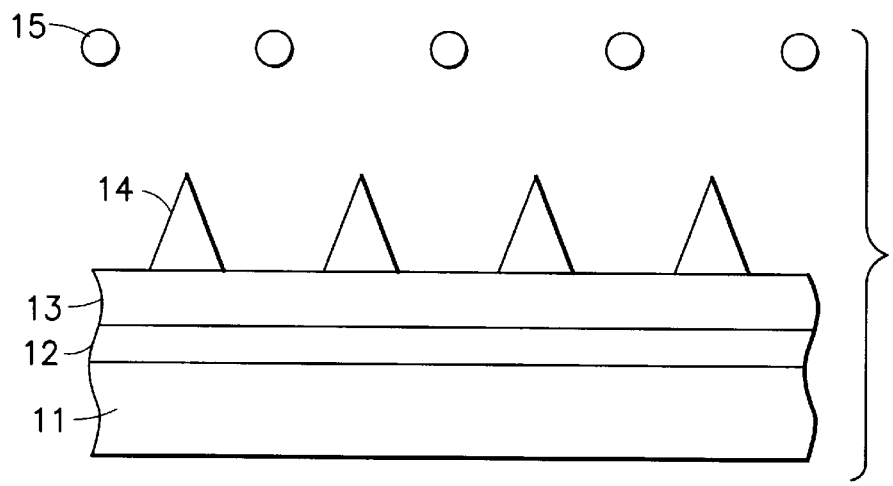
FIGS. 2(a) and 2(b) schematically illustrate field emission devices in accordance with further embodiments of the present invention having respectively different cathode and extraction electrode structures.
Figure 2B:
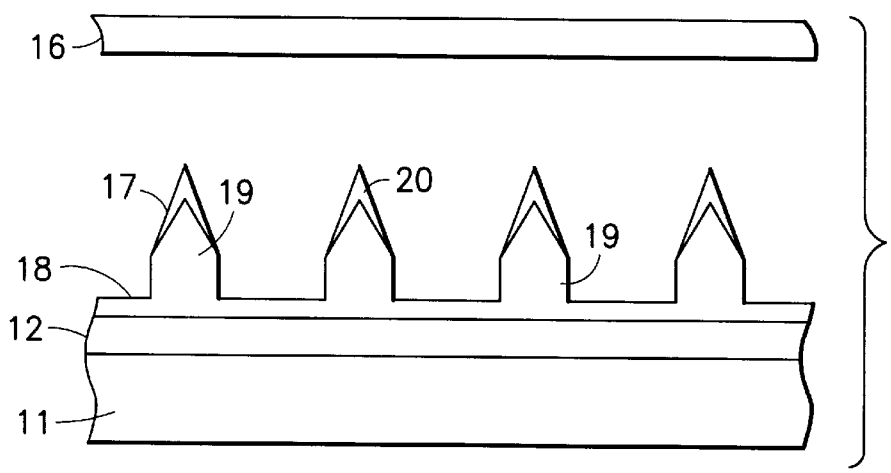

FIG. 2(b) is a schematic illustration of a field emission device having the same structure as that of FIG. 2(a), except that an anode 16 is employed as the extraction electrode in place of the grid 15 and emitters 17 are formed by altering the morphology of a resistor layer 18, for example, by etching to produce microtips 19 followed by deposition of an electron emissive material 20 on the microtips 19. In FIG. 2(b) each microtip 19 in effect acts as a separate resistor for the corresponding emitter 17. The anode 16 can be, for example, a metal electrode or a metallized or conductive phosphor. The structure shown in FIG. 2(b) may be used as a light source in which electrons emitted from the emitter 17 strike the phosphor causing light to be emitted. A simple display may be provided having separately addressable pixels each comprising the structure shown in FIG. 2(b). More specifically, in an alternative embodiment a plurality of separately electrically addressable phosphors are provided on a surface of anode 16 opposite the emitter 17 so that the phosphors may be scanned electrically to reproduce an image.

When a small amount of current is emitted by the emitters 17, the voltage drop across the resistor layers 13 and 18 is relatively small compared to that between the cathode electrode layer 12 and the gate 15 (FIG. 2(a)) or anode 16 (FIG. 2(b)). However, if the emitted current becomes large, a significant voltage drop will develop across the resistor layer 13 of FIG. 2(a) or layer 18 of FIG. 2(b). In these structures, the extraction electrode (gate 15 or anode 16) can be relatively far from the emitters 14 or 17 (typically more than 10 microns), and a relatively large voltage must be applied between the gate 15 and emitters 14 (FIG. 2(a)) or the anode 16 and emitters 17 (FIG. 2(b)) to induce emission. Accordingly, the resistor layers 13 and 18 must be provided with relatively large resistances to force a correspondingly greater voltage drop thereacross in order to provide a useful current limiting function.

Figure 3:
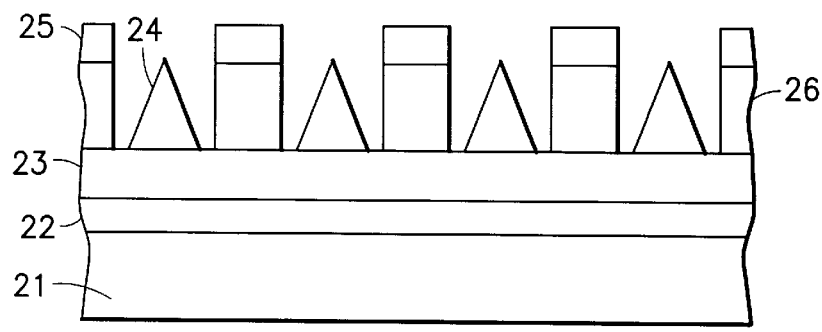
FIG. 3 schematically illustrates a field emission device in accordance with another embodiment of the present invention in which a gate extraction electrode is fabricated onto a cathode structure.
Figure 4:
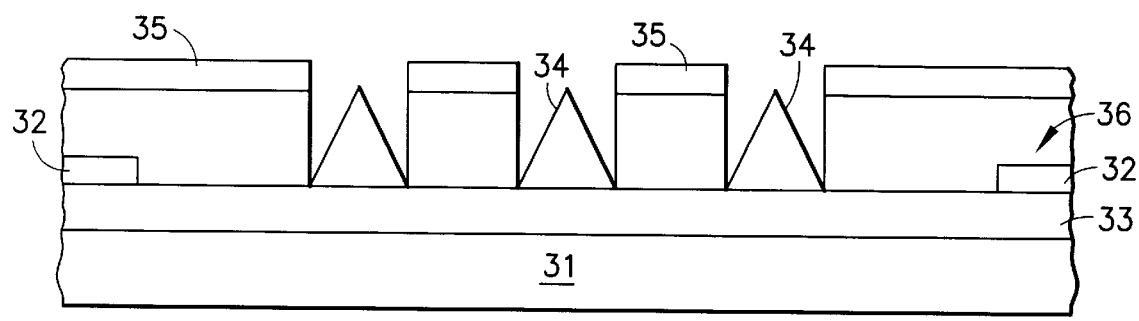
FIG. 4 is a schematic illustration of still another embodiment of a field emission device in accordance with the present invention having a lateral resistor arrangement.

FIGS. 3 and 4 are schematic illustrations of vertical resistor and lateral resistor field emission device structures, respectively. The structure of the device of FIG. 3 is essentially the same as that of FIG. 1(d) and includes a substrate 21, a cathode electrode layer 22 on the substrate 21, a resistor layer 23 on the cathode electrode layer 22, emitters 24 on the resistor layer 23, a dielectric layer 26 on the resistor layer 23 and gate electrodes 25 on the dielectric layer 26. As in the device of FIGS. 1 and 2, the resistor layer 23 comprises amorphous silicon carbide incorporating at least one impurity selected from the group consisting of hydrogen, halogens, nitrogen, oxygen, sulphur, selenium, transition metals, boron, aluminum, phosphorus, gallium, arsenic, lithium, beryllium, sodium and magnesium. In the device of FIG. 3, current flows mostly vertically from cathode electrode layer 22 through resistor layer 23 to emitters 24. The gate electrodes 25 are selectably addressable to turn on the pixels of a display using the FIG. 3 device.

The device of FIG. 4 includes a substrate 31, resistor layer 33 on the substrate 31 and having the same composition as resistor layer 23 of FIG. 3, a plurality of cathode electrodes 32 and emitters 34 formed on the resistor layer 33, a dielectric layer 36 over the cathode electrodes 32 and a number of gate electrodes 35 on the dielectric layer 36. The fabrication of the FIG. 4 device is similar to that of FIGS. 1(a) through 1(d). However, the resistor layer 33 is formed directly on the substrate 31 and a cathode electrode layer is formed on the layer 33. The dielectric layer 36 is formed on the cathode layer 32 and a gate layer is formed on the dielectric layer 36. Then portions of the resistor layer 33 are exposed through the gate, dielectric and cathode layers and the emitters 34 are formed on the exposed portions of the layer 33. The vertical resistor structure of FIG. 3 subjects the resistor layer to relatively higher electric fields than that of FIG. 4. However, the resistor materials employed in the inventive devices are capable of withstanding such fields without breakdown. Moreover, the structure of FIG. 3 is relatively easier to make than that of FIG. 4 since the structure of FIG. 4 requires additional smaller-scale lithography and accurate positioning of emitters 34 relative to the cathode electrodes 32. The device of FIG. 3, unlike those of FIGS. 2(a) and 2(b) permits the use of lower extraction voltages applied between the gates 25 and the emitters 24.

Figure 5A:
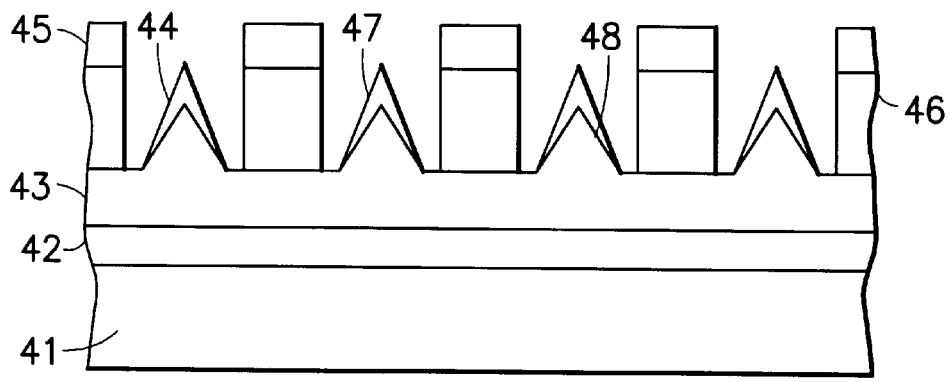
FIGS. 5(a) and 5(b) are schematic illustrations of field emission devices in accordance with still further embodiments of the present invention.

FIG. 5(a) is a schematic illustration of yet another field emission device having an electrically insulating substrate 41, a cathode electrode layer 42 on the substrate 41, a continuous resistor layer 43 on the cathode electrode layer 42, a dielectric layer 46 on the resistor layer 43 and gate electrodes 45 on the dielectric layer 46. The resistor layer 43 is also comprised of the same material as resistor layer 23 of FIG. 3. Microtip emitters 47 are formed in the same manner as emitters 7 of FIG. 1(d) to produce field enhancing tips 48 which are then covered with an electron emissive material 44 by evaporation or sputtering.

Figure 5B:
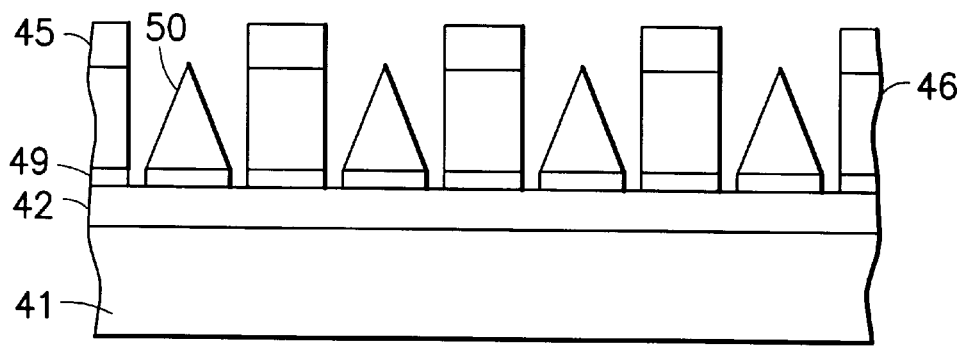

A further embodiment of such a device is illustrated schematically in FIG. 5(b) in which elements corresponding to those in FIG. 5(a) have the same reference numerals. The device of FIG. 5(b) is provided with a discontinuous resistor layer 49 of the same material as layer 23 of FIG. 3 comprising physically separated pedestals formed on cathode electrode layer 42 within wells formed in the dielectric layer 46. A microtip emitter 50 comprising an electron emissive material is supported on each pedestal of the resistor layer 49. The device of FIG. 5(b) is fabricated in essentially the same manner as that of FIGS. 1(a) through 1(d), but with the addition of a reactive ion etch to remove those portions of the resistor material exposed between the emitters 50 and the edges of the wells formed in the dielectric layer 46 in order to pattern the resistor layer 49 as a plurality of separated pedestals. The embodiment of FIG. 5(b) provides reduced crosstalk between neighboring emitters.

Figure 6:
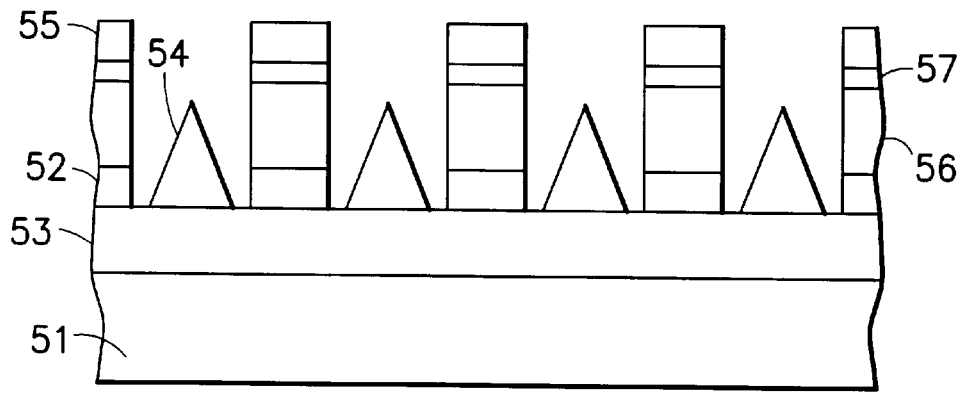
FIG. 6 is a schematic illustration of yet still another embodiment of a field emission device in accordance with the present invention incorporating a second resistor layer for protecting a gate dielectric against electrical breakdown.

With reference now to FIG. 6, a further embodiment of a field emission device is illustrated schematically therein having an electrically insulating substrate 51, a resistor layer 53 on the substrate 51, a cathode electrode layer 52 on the resistor layer 53, a plurality of microtip emitters 54 also on the resistor layer 53, a dielectric layer 56 on the cathode electrode layer 52, a further resistor layer 57 on the dielectric layer 56 and a plurality of gate electrodes 55 formed on the further resistor layer 57. The resistor layer 53 is formed of the same material as resistor layer 23 of FIG. 3. Layer 53 serves to homogenize the electron beam intensity from emitter to emitter and serves to limit current and can serve to prevent damage in the event of breakdown between the emitters 54 and the gate extraction electrodes 55. The further resistor layer 57 is formed of the same material as layer 53 and serves to limit current and prevent damage in the event of breakdown in the dielectric layer 56 or in the resistor layer 53. The layer 57 together with the layer 53 may also provide the ability to withstand greater breakdown voltages than the layer 53 can withstand by itself, especially where the thickness of layer 53 cannot be increased to provide this capability. For example, the thickness of layer 53 may be limited to avoid cracking and delamination, and/or to prevent emitter interaction.

Also, the device may be provided with a positive gate bias voltage with respect to the cathode electrode layer 52 applied through the resistor layer 57 so that a current flows from the emitters 54 through the gate electrodes 55 to the layer 57. The gate electrodes 55 thus absorb a fraction of the emitter current and the further resistor layer 57 functions to lower the voltage level of the gate electrodes 55 in order to limit the emitter current.

Figure 7A:
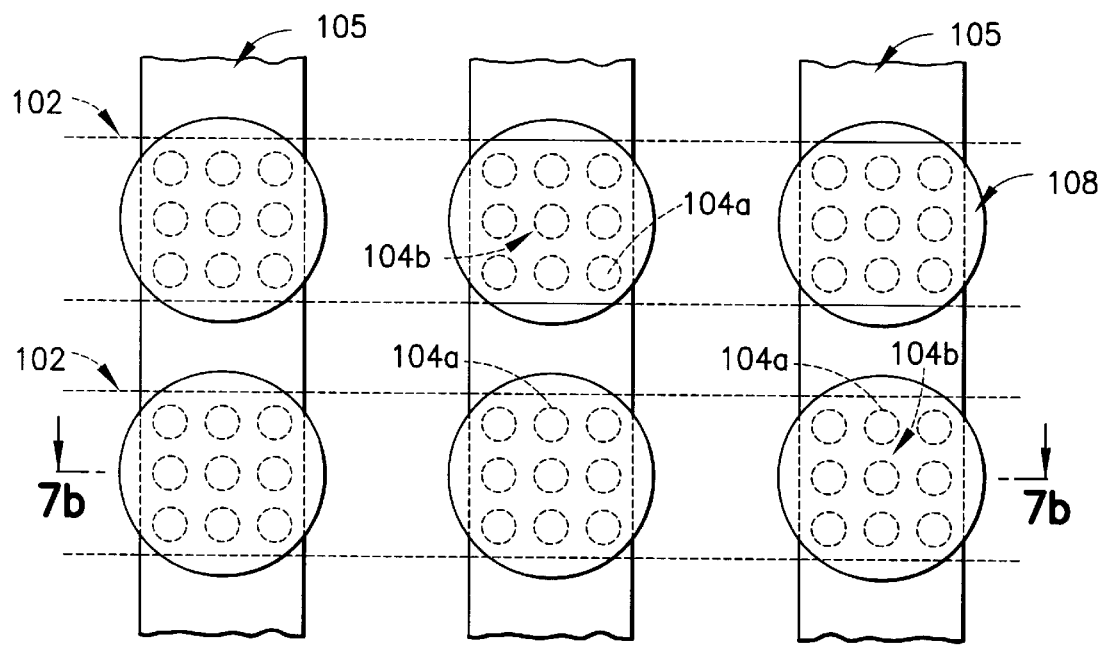
FIG. 7(a) is a schematic illustration of a flat panel field emission display device in accordance with an embodiment of the present invention.
Figure 7B:
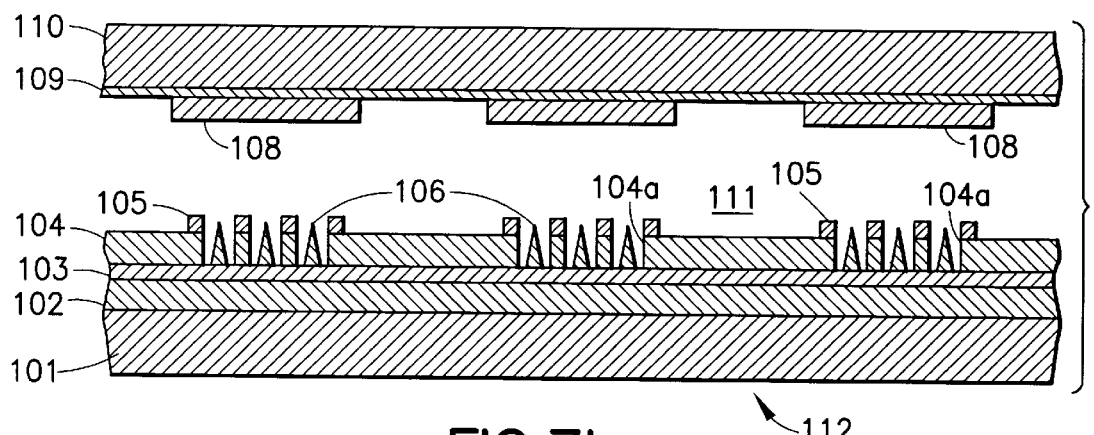
FIG. 7(b) is a cross-sectional view of the device of FIG. 7(a) taken along the lines 7(b)—7(b) thereof.

FIGS. 7(a) and 7(b) schematically illustrate a flat panel field emission display device in accordance with a further embodiment of the present invention. FIG. 7(a) schematically illustrates the device as viewed through a transparent phosphor substrate 110 and transparent conductor layer 109 illustrated in FIG. 7(b) which is a cross-sectional view taken along the lines 7(b) and 7(b) of FIG. 7(a).

With reference in particular to FIG. 7(b) a field emission cathode device 112 is formed on a substrate 101. Cathode electrodes 102 of the field emission cathode device 112 are formed on an upper surface of the substrate 101 as a plurality of parallel row electrodes as illustrated in FIG. 7(a). A resistor layer 103 comprising the same material as the resistor layer 23 of FIG. 3, is formed on the cathode electrodes 102. A dielectric layer 104 is formed on the resistor layer 103. A number of apertures 104a extend through the dielectric layer 104 to the resistor layer 103 over the cathode electrodes 102 and concentrated in emitter clusters 104b as seen in FIG. 7(a). Electron emitters 106 are formed on the resistor layer 103 in the apertures 104a. A plurality of gate electrodes 105 are formed on the dielectric layer 104 adjacent the apertures 104a and arranged in a plurality of separately addressable columns as best seen in FIG. 7(a).

With reference to FIG. 7(b) the transparent phosphor substrate 110 is spaced from the field emission cathode device 112 opposite the electron emitters 106 thereof. The transparent conductor 109 comprising, for example, indium tin oxide (ITO) is formed on a surface of the substrate 110 opposite the field emission cathode device 112. In the alternative, a transparent semiconductor may be substituted for conductor 109. A plurality of phosphor disks 108 are formed on the transparent conductor 109 such that each is arranged opposite a respective emitter cluster 104b including a plurality of respective electron emitters 106. A below-atmospheric pressure region 111 is formed between the phosphor disks 108 and the electron emitters 106.

In operation, each of the phosphor disks 108 is selected as appropriate to emit light by selectively projecting an electron beam thereon from the electron emitters 106 of the corresponding emitter cluster 104b in order to produce a desired image. The electron beam is controlled by selectively applying appropriate voltage levels to the corresponding cathode electrode 102 and gate electrode 105 so that a sufficient voltage drop is produced between the selected gate electrode and cathode electrode to cause the electron emitters of the corresponding emitter cluster to emit an electron beam toward the phosphor 108. A positive voltage level with respect to the emitters 106 is applied to the transparent conductor 109 so that the emitted electrons are received by the selected phosphor disk 108 which then emits light through the transparent conductor 109 and transparent phosphor substrate 110.

Figure 8:
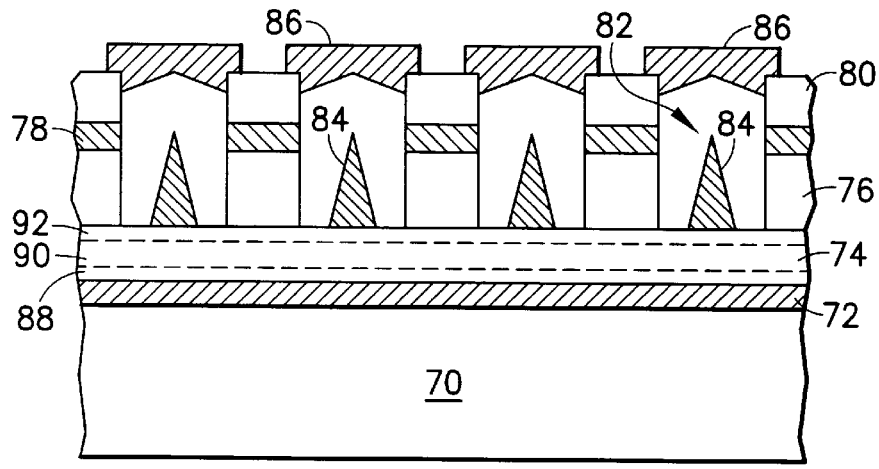
FIG. 8 is a schematic illustration of an integrated circuit field emission device in accordance with an embodiment of the present invention.

FIG. 8 schematically illustrates a still further field emission device having an electrically insulating substrate 70, a cathode electrode layer 72 on the substrate 70, a resistor layer 74 on the cathode electrode layer, a first dielectric layer 76 on the resistor layer 74, a gate layer 78 on the first dielectric layer 76 comprising a plurality of gate electrodes, and a second dielectric layer 80 on the gate layer 78. The resistor layer 74 is formed of the same material as resistor layer 23 of FIG. 3. Apertures 82 are formed in the dielectric layers 76 and 80 and the gate layer 78, and a plurality of microtip emitters 84 are formed in the apertures on the exposed surface of the resistor layer 74.

Each aperture 82 is capped by a respective anode electrode of an anode layer 86 formed for example by glancing incidence metal evaporation from a source offset from the device. The device is rotated as the anode material is deposited in order to provide uniform deposition of the material. Patterning and etching may be used to form individual elements. Where the device of FIG. 8 is to be used as a flat panel display, the anode material is a light transmissive conductor, such as indium-tin oxide (ITO), or semiconductor material, coated with a phosphor. Where the device of FIG. 8 is an array of active circuit elements not serving as a display, the anode material may be, for example, a metal or other conductive or semiconductive material.

The resistor layer 74 preferably comprises a first, lower region 88 having a relatively low concentration of a dangling-bond-terminating impurity and/or relatively high level of a dopant impurity to provide relatively low resistivity to produce a good ohmic contact with the cathode electrode layer 72. The layer 74 has a second, middle region 90 of relatively high resistivity due to a relatively high concentration of a dangling-bond-terminating impurity selected to assist in defining the overall, average resistivity of the resistor layer 74. Finally, the resistor layer 74 has a third, upper region 92 of relatively low resistivity like the first region 88 to afford good ohmic contact with the microtip emitters 84.

Figure 9:
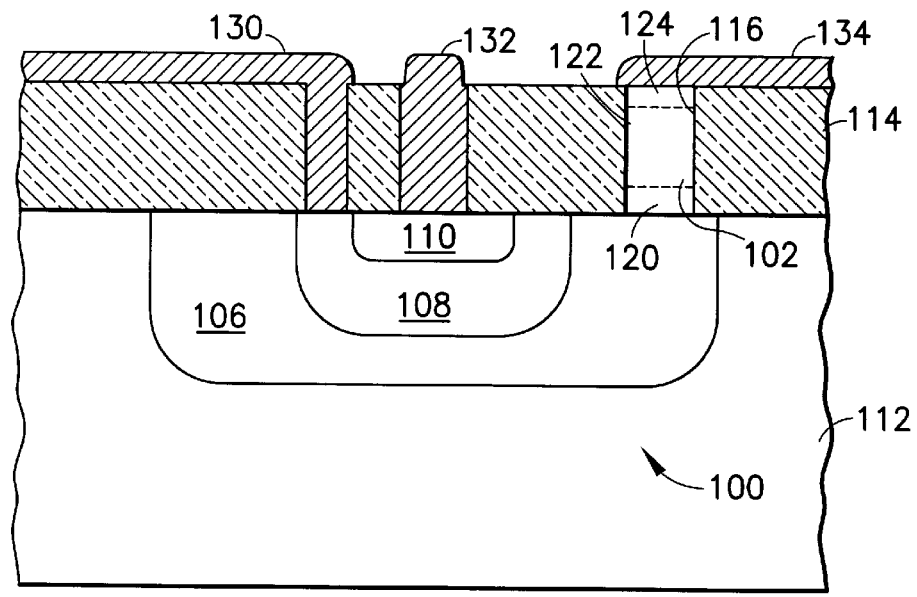
FIG. 9 is a schematic illustration of an integrated circuit device incorporating a transistor and a resistor element in accordance with yet another embodiment of the present invention.

FIG. 9 is a schematic illustration of an integrated circuit comprising a transistor 100 and a load resistor element 102 comprised of the same material as the resistor layer 23 of FIG. 3. The transistor 100 includes a collector region 106, a base region 108 and an emitter region 110, each formed, for example, by implantation or diffusion of suitable dopants in a semiconductor substrate 112. A dielectric layer 114 is formed on an upper surface of the substrate 100.

An aperture 116 is formed through the dielectric layer 114 to the upper surface of the substrate and the collector region 106. The load resistor element 102 is grown or deposited in the aperture 116 to have a first, lower region 120 of relatively low resistivity forming a good ohmic contact with the collector region 106, a second, middle region 122 of relatively higher resistivity contiguous with the region 120 defining the average, overall resistivity of the resistor element 102, and a third, upper region 124 of relatively lower resistivity contiguous with the second region 122. Apertures are formed through the dielectric layer 114 to the base region 108 and the emitter region 110, and metallization patterns 130, 132, and 134 are formed on an upper surface of the layer 114 to provide contacts respectively for the base region 108, the emitter region 110 and a first terminal of the resistor element 102 opposite its connection to the collector region 106. A further aperture through the dielectric layer 114 (not shown for purposes of simplicity and clarity) and associated metallization pattern provides electrical contact with the collector region 106. The upper, low resistivity region of the resistor element 102 provides good ohmic contact with the metallization pattern 134.

The device of FIG. 9 can serve, for example, as a pull-down output of an integrated logic circuit or as an amplifier or other active device in an analog integrated circuit.

Figure 10:
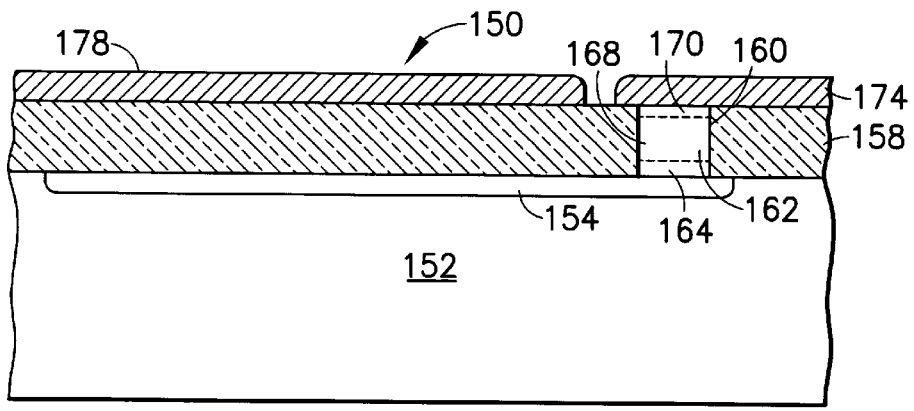
FIG. 10 is a schematic illustration of an integrated circuit incorporating a capacitor and a resistor element in accordance with still another embodiment of the present invention.

With reference now to FIG. 10, an integrated circuit 150 is illustrated in cross-section therein which includes the series connection of a capacitor and a resistor element comprised of the same material as the resistor layer 23 of FIG. 3. The integrated circuit 150 includes a semiconductor substrate 152 in which a conductive or semiconductive region 154 has been formed through an upper surface thereof, for example, by implantation or diffusion of a dopant impurity. A dielectric layer 158 is formed on the upper surface of the substrate 152 and an aperture 160 is formed through the dielectric layer 158 to the upper surface of the substrate 152 and of the region 154. A resistor element 162 is grown or deposited in the aperture 160 to have a first, lower region 164 of relatively low resistivity forming a good ohmic contact with the region 154, a second, middle region 168 of relatively higher resistivity contiguous with the region 164 defining the average, overall resistivity of the resistor element 162, and a third, upper region 170 of relatively lower resistivity contiguous with the second region 168. A metallization pattern 174 is formed on an upper surface of the dielectric layer 158 to provide a contact with a first terminal of the resistor element 162. A second opposite terminal of the resistor element 162 makes a substantially ohmic contact with the region 154.

A second metallization pattern 178 is formed on the upper surface of the dielectric layer 158 opposite the region 154, so that the region 154 and the metallization pattern 178 form opposing plates of a capacitor separated by the dielectric layer 158.

It will be appreciated that integrated circuit of FIG. 10 provides a series connection of the resistor element 162 with the capacitor formed by the region 154, metallization pattern 178 and dielectric layer 158 therebetween. In order to arrange the resistor element in parallel with the capacitor in certain other embodiments, the metallization pattern 174 is connected to the metallization pattern 178 or else a single metallization pattern including both patterns 174 and 178 of FIG. 10 is formed on the upper surface of the substrate 158.

Although specific embodiments of the inventions have been described in detail herein with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A field emission device having a resistor element which comprises amorphous $Si_xC_{1-x}$ wherein 0<x<1, wherein the $Si_xC_{1-x}$ incorporates at least one impurity selected from the group consisting of hydrogen, halogens, nitrogen, oxygen, sulphur, selenium, transition metals, boron, aluminum, phosphorus, gallium, arsenic, lithium, beryllium, sodium and magnesium.

2. A field emission device according to claim 1, wherein the $Si_xC_{1-x}$ has a resistivity ranging from $10^4$ ohm cm to $10^{10}$ ohm cm.

3. A field emission device according to claim 1, wherein the $Si_xC_{1-x}$ incorporates at least one impurity selected from the group consisting of hydrogen, halogens, nitrogen, and oxygen.

4. A field emission device according to claim 3, wherein the $Si_xC_{1-x}$ incorporates nitrogen as an impurity.

5. A field emission device according to claim 4, wherein the nitrogen is incorporated in the $Si_xC_{1-x}$ at least in part as a terminating species.

6. A field emission device according to claim 4, wherein the nitrogen is incorporated in the $Si_xC_{1-x}$ at least in part in the form of a nitride.

7. A field emission device according to claim 1, wherein the $Si_xC_{1-x}$ incorporates at least one impurity selected from the group consisting of sulphur, selenium, transition metals, boron, aluminum, phosphorus, gallium, arsenic, lithium, beryllium, sodium and magnesium.

8. A field emission device according to claim 1, further comprising at least one electron emitting structure and wherein said device is formed on a substrate and said resistor element is formed integrally therewith and coupled to said emitting structure.

9. A field emission device according to claim 8, wherein the emitting structure is coupled to the resistor element by direct contact therewith over an area of no more than about $10^{-8}$ cm$^2$.

10. A field emission device according to claim 8, wherein the emitting structure is coupled electrically through the resistor element to a cathode electrode.

11. A field emission device according to claim 8, wherein the at least one electron emitting structure comprises a plurality of electron emitting structures.

12. A field emission device according to claim 10, wherein the cathode electrode comprises a cathode electrode layer on the substrate, the resistor element comprises a resistor layer having a first surface on the cathode electrode layer and a second surface opposite the first surface, and the emitting structure is on the second surface of the resistor layer.

13. A field emission device according to claim 8, wherein the substrate comprises at least one material selected from the group consisting of ceramics, glasses, semiconductors, metals and alloys.

14. The field emission device according to claim 8, further comprising a gate for controlling the application of electric fields to the electron emitting structure.

15. The field emission device according to claim 8, further comprising an anode.

16. The field emission device according to claim 15, wherein the anode comprises a phosphor positioned to receive electrons from the at least one electron emitting structure to thereby emit light.

17. The field emission device of claim 16, wherein the anode comprises a plurality of separately addressable phosphors.

18. The field emission device according to claim 10, wherein the cathode electrode comprises a cathode electrode layer on the substrate and said resistor element is in contact with said cathode electrode layer.

19. The field emission device according to claim 8, wherein the resistor element comprises a plurality of resistor regions arranged on a surface of the substrate.

20. The field emission device of claim 8, comprising a plurality of electron emitter structures arranged as a plurality of field emission cathode regions each having a plurality of electron emitter structures, the plurality of field emission cathode regions being spaced apart on the substrate.

21. The field emission device of claim 20, further comprising a dielectric region formed on the substrate, the dielectric region having a plurality of apertures therethrough defining the field emission cathode regions; and a plurality of gate electrodes formed on a surface of the dielectric region opposite the substrate.

22. The field emission device according to claim 21, further comprising a plurality of row electrodes forming portions of a surface of the substrate, and wherein said electron emitter structures form a plurality of field emission cathode regions arranged in a rectangular pattern over the plurality of row electrodes, and the plurality of gate electrodes are arranged in a plurality of columns with respect to the rectangular pattern of the plurality of field emission cathode regions.

23. An integrated circuit comprising:
 a substrate;
 a first current conducting region adjacent a first surface of the substrate;
 a resistor layer on the first current conducting region, the resistor layer comprising amorphous $Si_xC_{1-x}$ wherein $0<x<1$, and wherein the $Si_xC_{1-x}$ incorporates at least one impurity selected from the group consisting of hydrogen, halogens, nitrogen, oxygen, sulphur, selenium, transition metals, boron, aluminum, phosphorus, gallium, arsenic, lithium, beryllium, sodium and magnesium, the resistor layer having a first region of first resistivity contiguous with the first current conducting region; and
 a second current conducting region on a surface of the resistor layer opposite the first current conducting region;
 the resistor layer having a second region of second resistivity continuous with the second current conducting region and a third region intermediate the first and second regions and having a third resistivity higher than the first and second resistivities.

24. The integrated circuit of claim 23, wherein the $Si_xC_{1-x}$ incorporates at least one impurity selected from the group consisting of hydrogen, halogens, nitrogen and oxygen.

25. The integrated circuit of claim 24, wherein the $Si_xC_{1-x}$ incorporates nitrogen as an impurity.

26. The integrated circuit of claim 25, wherein the nitrogen is incorporated in the $Si_xC_{1-x}$ at least in part as a terminating species.

27. The integrated circuit of claim 25, wherein the nitrogen is incorporated in the $Si_xC_{1-x}$ at least in part in the form of a nitride.

28. The integrated circuit of claim 23, wherein the $Si_xC_{1-x}$ incorporates at least one impurity selected from the group consisting of sulphur, selenium, transition metals, boron, aluminum, phosphorus, gallium, arsenic, lithium, beryllium, sodium and magnesium.

29. The integrated circuit of claim 23, wherein the resistor layer is on the substrate and the first current conducting layer is formed in the substrate.

30. The integrated circuit of claim 23, wherein the first current conducting layer is on the substrate and the resistor layer is on the first current conducting layer.

31. The integrated circuit of claim 23, wherein the first current conducting layer comprises' a metal.

32. The integrated circuit of claim 23, wherein the first current conducting layer comprises a semiconductor material.

33. The integrated circuit of claim 23, wherein the resistor layer is coupled in current conducting relation with a current utilization device.

34. An integrated circuit, comprising:
 a substrate;
 a field emission device;
 a resistor layer comprising amorphous $Si_xC_{1-x}$ wherein $0<x<1$, and wherein the $Si_xC_{1-x}$ incorporates at least one impurity selected from the group consisting of hydrogen, halogens, nitrogen, oxygen, sulphur, selenium, transition metals, boron, aluminum, phosphorus, gallium, arsenic, lithium, beryllium, sodium and magnesium, the resistor layer being coupled in current conducting relationship with the field emission device; and
 a first current conducting layer;
 the resistor layer having a first region of first resistivity continuous with the first current conducting layer and a second layer of second resistivity higher than the first resistivity and contiguous with the first region, the second region being spaced from the first current conducting layer by the first region;
 a first one of the resistor layer and the first current conducting layer being on the substrate and a second one of the resistor layer and the current conducting layer being on the first one thereof.

35. The integrated circuit of claim 33, wherein the current utilization device comprises a transistor.

36. The integrated circuit of claim 33, wherein the current utilization device comprises a capacitor.

37. An integrated circuit comprising:
 a substrate;
 a resistor element formed on the substrate and comprising amorphous $Si_xC_{1-x}$ wherein $0<x<1$, and wherein the $Si_xC_{1-x}$ incorporates at least one impurity selected from the group consisting of hydrogen, halogens, nitrogen, oxygen, sulphur, selenium, transition metals, boron, aluminum, phosphorus, gallium, arsenic, lithium, beryllium, sodium and magnesium; and
 a current conducting element formed on or in the substrate and contacting the resistor element with a contact area of no more that about $10^{-8}$ cm$^2$.

38. The integrated circuit of claim 37, wherein the current conducting element comprises a field emission device.

39. The integrated circuit of claim 37, wherein the current conducting element comprises a transistor.

40. The integrated circuit of claim 37, wherein the current conducting element comprises a capacitor.

* * * * *

UNITED STATES PATENT AND TRADEMARK OFFICE
CERTIFICATE OF CORRECTION

PATENT NO. : 6,031,250
DATED : February 29, 2000
INVENTOR(S) : Brandes et al.

Page 1 of 1

It is certified that error appears in the above-identified patent and that said Letters Patent is hereby corrected as shown below:

Column 1,
Line 4, the following text:

--GOVERNMENT RIGHTS IN INVENTION

This invention was made with the support of the U.S. Government under Contract No. N00014-93-C-0264 awarded by the Office of Naval Research. The Government has certain rights in this invention. --

Signed and Sealed this

Twenty-third Day of April, 2002

*Attest:*

JAMES E. ROGAN
*Director of the United States Patent and Trademark Office*

*Attesting Officer*